United States Patent [19]

Curbelo

[11] Patent Number: 4,958,308
[45] Date of Patent: Sep. 18, 1990

[54] TECHNIQUE FOR IMPROVING THE RESOLUTION OF AN A/D CONVERTER

[75] Inventor: Raul Curbelo, Lexington, Mass.

[73] Assignee: Bio-Rad Laboratories, Inc., Hercules, Calif.

[21] Appl. No.: 260,835

[22] Filed: Oct. 21, 1988

[51] Int. Cl.⁵ .............................................. H03M 1/20
[52] U.S. Cl. .................................... 364/574; 341/118; 341/122; 341/131; 324/322
[58] Field of Search ........................ 364/571, 574, 576; 341/118, 122, 126, 131, 155–162; 324/318, 322

[56] References Cited

U.S. PATENT DOCUMENTS 4,616,239 3/1986 Abrams ............................... 364/571

FOREIGN PATENT DOCUMENTS 0104522 6/1983 Japan ................................. 341/118
8504995 11/1985 World Int. Prop. O. .......... 341/122

Primary Examiner—Parshotam S. Lall
Assistant Examiner—Michael Zanelli
Attorney, Agent, or Firm—Townsend and Townsend

[57] ABSTRACT

The present invention provides a technique for improving the resolution of an A/D converter. The input analog signal is sampled to generate an analog level and the analog level is held for an interval. A random noise signal having zero average value is superimposed on the held level to generate a fluctuating voltage. This fluctuating voltage is then sampled a plurality of at least N times, and N sampled values are communicated to the A/D converter so that N digitized values are generated. These digitized values are averaged to provide an output having a digitization error reduced by a factor of $N^{\frac{1}{2}}$.

7 Claims, 1 Drawing Sheet

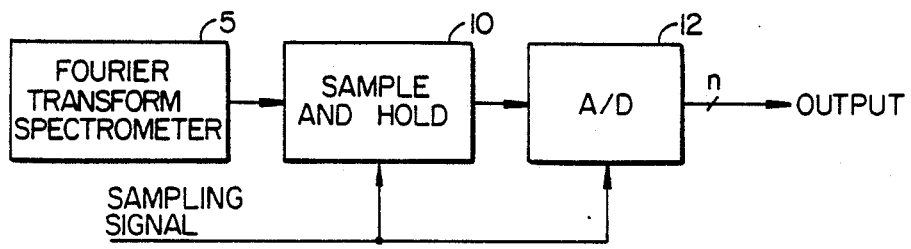
FIG._1. (PRIOR ART)
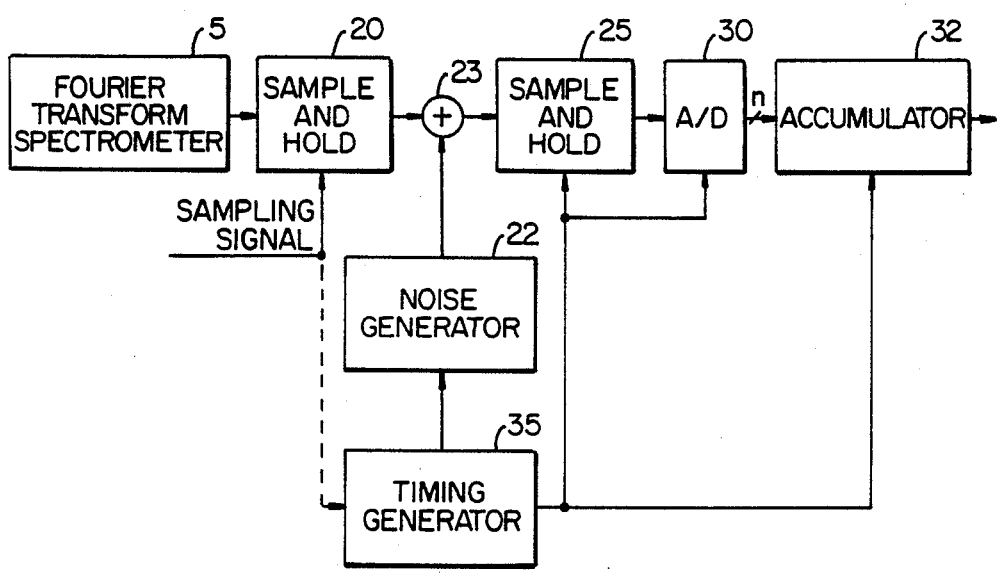
FIG._2.

TECHNIQUE FOR IMPROVING THE RESOLUTION OF AN A/D CONVERTER

FIELD OF THE INVENTION

The present invention relates generally to signal processing, and more specifically to circuitry for improving the resolution of an A/D converter.

BACKGROUND OF THE INVENTION

Analog-to-digital converters (A/D converters) are well known devices for providing a digital representation of an analog voltage at the A/D input. Typical A/D converters provide a 16-bit output, but this is not fundamental. However, depending upon the number of bits resolution provided by the A/D converter, the resolution is limited.

Certain classes of input signal that must be digitized are characterized by a high ratio between maximum and minimum values. An example is the signal from a Fourier transform spectrometer. This signal, which varies as a function of the position of the interferometer's moving mirror, is characterized by a relatively huge central peak (referred to as a centerburst) occurring over a narrow range of mirror position. If the A/D converter is set so that the maximum voltage (which occurs at the centerburst) provides nearly the maximum digital output, the resolution of the output will be quite low over most of the mirror's travel. Currently, the problem is addressed by using gain ranging near the centerburst. This technique entails reducing (for example, by a factor of 16) the analog voltage that is input to the A/D converter when the mirror is in the vicinity of the centerburst position. However, it then becomes impossible to measure noise in the centerburst region.

SUMMARY OF THE INVENTION

The present invention provides a technique for improving the resolution of an A/D converter output to enable the measurement of signals having a high dynamic range.

The input analog signal is sampled to generate an analog level and the analog level is held for an interval. A random noise signal having zero average value is superimposed on the held level to generate a fluctuating voltage. This fluctuating voltage is then sampled a plurality of at least N times, and N sampled values are communicated to the A/D converter so that N digitized values are generated. These digitized values are averaged to provide an output having a digitization error reduced by a factor of $N^{\frac{1}{2}}$. The technique is typically carried out with a high speed A/D converter so that a large number of samples of the fluctuating voltage can be digitized for each sampling of the input signal.

A further understanding of the nature and advantages of the present invention may be realized by reference to the remaining portions of the specification and the attached drawings.

BRIEF DESCRIPTION OF THE DRAWINGS

FIG. 1 is a block diagram of prior art circuitry for providing digitized values corresponding to an analog input signal; and FIG. 2 is a block diagram illustrating circuitry for increasing the effective resolution of an A/D converter according to the present invention.

DESCRIPTION OF THE PREFERRED EMBODIMENT

The present invention provides improved circuitry and method for generating a digital representation of a time-varying analog input signal. For concreteness, the circuitry will be described in the context of digitizing the analog signal from a Fourier transform spectrometer. As the movable mirror in the interferometer travels on its path, each frequency component of the light passing through the interferometer is modulated at a different frequency proportional to the optical frequency. Thus, the signal to the detector is the superposition of all wavelength components in the beam, each modulated at a different frequency. The spectrometer also includes a laser fringe reference system that provides pulses for each increment of mirror movement equal to half the laser wavelength. This signal is relatively constant in frequency since the mirror is moved at close to constant velocity. The spectrometer output signal typically has frequency components in the range of a few to several kilohertz.

FIG. 1 shows a prior art circuit wherein the analog signal from a Fourier transform spectrometer 5 is communicated to the voltage input of a sample and hold circuit 10, which provides a DC level at its output when clocked by a sampling signal at its sampling input. This DC level is communicated to an analog-to-digital converter ("A/D converter") 12, which is also clocked by the sampling signal. Assuming A/D converter 12 to have an n-bit output (n=16 is typical), the resolution is one part in $2^n$. For a 16-bit A/D converter and analog input signals covering ±10 volts, the digitization increment is about 0.3 mv.

FIG. 2 is a block diagram of circuitry according to the present invention. The analog input signal from a Fourier transform spectrometer 5 is communicated to a first sample and hold circuit 20, which is clocked by the sampling signal from the laser reference system. Sample and hold circuit 20 provides a DC level corresponding to the value of the voltage of the input signal at the time of sampling. A noise generator 22 generates a random or pseudorandom signal whose spectrum does not overlap with the desired region of the spectrum of the analog input signal. The random fluctuations are superimposed on the output from first sample and hold circuit 20 at a summing node 23. The resulting fluctuating voltage is communicated to the input of a second sample and hold circuit 25, the DC level of which is communicated to the input of an A/D converter 30. The n-bit A/D digital output is communicated to an accumulator 32.

The noise signal should be characterized by a sufficiently large maximum value so that the maximum fluctuations at the input to A/D converter 30 significantly exceed the digitizing increment. A factor of 5-20 is generally sufficient. Therefore, where the digitizing increment is about 0.3 mv, the maximum voltage fluctuations at the A/D converter input should be a few to several millivolts.

A timing generator 35 clocks sample and hold circuit 25, A/D converter 30, and accumulator 32. Timing generator 35 runs at a speed typically 1-2 orders of magnitude above the frequency of the sampling signal. Accordingly, for each value of output voltage held by sample and hold circuit 20, a plurality of DC levels are generated by sample and hold circuit 25. Accumulator 32 and possibly A/D converter 30 are gated to accept some or all of these. Accumulator 32 co-adds the digital outputs from A/D converter 30, and outputs a single value. If N is the number of digital outputs, the result is a resolution increased by a factor of $N^{\frac{1}{2}}$ relative to the resolution obtainable from a single digitization of A/D converter 30.

The sampling signal's communication with timing generator 35 is shown in phantom. The reason for this is that timing generator 35 may be synchronous (in which case the sampling signal would define the clock rate), or it may be asynchronous. In a typical application (synchronous or asynchronous), timing generator 35 may be run at a frequency of 100–150 times the frequency of the sampling signal and the accumulator gated to accept a smaller number (say 60–100) digitizations from A/D converter 30. Alternatively, sample and hold circuit 25 or A/D converter 30 can be gated so that only the smaller number of digitizations are communicated to accumulator 32.

The circuit components are generally off-the shelf items. The sample and hold circuits may be modules, integrated circuits, or (in the case of sample and hold circuit 25) circuitry incorporated into the front end of A/D converter 30. Noise generator 22 needs to provide several millivolts maximum signal. The randomness may be derived from the thermal noise from a diode. Summing node 23 may be an operational amplifier. A high-speed A/D converter capable of operation at 500 kHz is available from Analogic, Woburn, Mass.

In conclusion, it can be seen that the present invention provides a simple technique for increasing the resolution of an A/D converter so as to increase the dynamic range of a measurement system. While the above is a complete description of the preferred embodiment of the invention, various modifications, alternative constructions, and equivalents may be employed. Accordingly, the above description and illustrations should not be taken as limiting the scope of the invention which is defined by the appended claims.

I claim:

1. A method of digitizing the output signal from a Fourier transform spectrometer, comprising the steps of:

communicating an analog voltage level representing the output signal to a summing node;

superimposing random noise fluctuations having an average value of zero on the analog voltage level at the summing node to provide a fluctuating voltage signal centered at the analog voltage level and having a duration of at least a predetermined time interval;

sampling the fluctuating voltage signal a plurality of N times during the tim interval to provide a plurality of N voltages;

communicating the N voltages, one at a time, to the input of an A/D converter having a given resolution to provide N digitized values; and averaging the N digitized values to provide an output with a digitization error reduced by a factor of $N^{\frac{1}{2}}$.

2. A method of digitizing the output signal from a Fourier transform spectrometer, comprising the steps of:

sampling the spectrometer output signal to generate an analog voltage level whose value equals the value of the spectrometer output signal at the moment of sampling;

holding the analog voltage level for at least a predetermined time interval;

superimposing random noise fluctuations having an average value of zero on the analog voltage level to provide a fluctuating voltage signal centered at the analog voltage level and having a duration of at least the predetermined time interval;

sampling the fluctuating voltage signal a plurality of N times during the time interval to provide a plurality of N voltages;

communicating the N voltages, one at a time, to the input of an A/D converter having a given resolution to provide N digitized values; and averaging the N digitized values to provide an output with a digitization error reduced by a factor of $N^{\frac{1}{2}}$.

3. The method of claim 2 wherein all of said steps are performed a plurality of times in repeated sequences.

4. Apparatus for digitizing the output signal from a Fourier transform spectrometer, comprising:

means for superimposing random noise fluctuations having an average value of zero on an analog voltage level representing the output signal to provide a fluctuating voltage signal centered at the analog voltage level and having a duration of at least a predetermined time interval;

sample and hold means for providing N analog voltage levels corresponding to N values of said fluctuating voltage signal occurring during the time interval;

an A/D converter having a given resolution;

means for communicating said N analog voltage levels to said A/D converter for providing N digitized values; and means for coadding the N digitized values to provide an average value having increased resolution by a factor of $N^{\frac{1}{2}}$.

5. The apparatus of claim 4 wherein said A/D converter has a particular digitization increment, and said fluctuating voltage has maximum fluctuations that exceed the digitization increment.

6. Apparatus for digitizing the output signal from a Fourier transform spectrometer, comprising:

first sample and hold means, responsive to the spectrometer output signal, for providing an analog voltage level whose value equals the value of the spectrometer output signal at a particular moment;

means for superimposing random noise fluctuations having an average value of zero on said analog voltage level from said first sample and hold means to provide a fluctuating voltage signal centered at said analog voltage level and having a duration of at least a predetermined time interval.

second sample and hold means for providing N analog voltage levels corresponding to N values of said fluctuating voltage signal occurring during the tim e interval;

an A/D converter having a given resolution;

means for communicating said N analog voltage levels to said A/D converter for providing N digitized values; and means for coadding the N digitized values to provide and average value having increased resolution by a factor of $N^{\frac{1}{2}}$.

7. The apparatus of claim 6 wherein said A/D converter has a particular digitization increment, and said fluctuating voltage has maximum fluctuations that exceed the digitization increment.

* * * * *